US010541168B2

(12) United States Patent
Tan et al.

(10) Patent No.: US 10,541,168 B2
(45) Date of Patent: Jan. 21, 2020

(54) EDGE RING CENTERING METHOD USING RING DYNAMIC ALIGNMENT DATA

(71) Applicant: LAM RESEARCH CORPORATION, Fremont, CA (US)

(72) Inventors: Ali Sucipto Tan, Fremont, CA (US); Haoquan Yan, Fremont, CA (US); Marc Estoque, San Jose, CA (US); Damon Tyrone Genetti, Livermore, CA (US); Jon McChesney, Fremont, CA (US); Alexander Miller Paterson, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 64 days.

(21) Appl. No.: 15/799,011

(22) Filed: Oct. 31, 2017

(65) Prior Publication Data

US 2018/0138069 A1 May 17, 2018

Related U.S. Application Data

(60) Provisional application No. 62/421,569, filed on Nov. 14, 2016.

(51) Int. Cl.
*H01L 21/68* (2006.01)
*H01L 21/687* (2006.01)

(52) U.S. Cl.
CPC ........ *H01L 21/68* (2013.01); *H01L 21/68721* (2013.01); *H01L 21/68735* (2013.01); *H01L 21/68742* (2013.01)

(58) Field of Classification Search
None
See application file for complete search history.

(56) References Cited

U.S. PATENT DOCUMENTS 6,430,468 B1 * 8/2002 Tepman ............ H01L 21/67748
414/222.04
2003/0186563 A1 * 10/2003 Kobayashi ............ H01L 21/324
438/795

(Continued)

FOREIGN PATENT DOCUMENTS

WO 2009086109 A2 7/2009

OTHER PUBLICATIONS

Notification of Transmittal of International Search Report and the Written Opinion of the International Searching Authority dated Feb. 22, 2018, 16 pages.

*Primary Examiner* — Vu Le
*Assistant Examiner* — Tracy Mangialaschi

(57) ABSTRACT

A system for determining an alignment of an edge ring on a substrate support includes a robot control module configured to control a robot to place the edge ring onto the substrate support and retrieve the edge ring from the substrate support. An alignment module is configured to determine a plurality of first positions of the edge ring on the robot prior to being placed onto the substrate support and determine a plurality of second positions of the edge ring on the robot subsequent to being retrieved from the substrate support. An edge ring position module configured to determine a centered position of the edge ring relative to the substrate support based on offsets between the plurality of first positions and the plurality of second positions.

19 Claims, 7 Drawing Sheets

(56) References Cited

U.S. PATENT DOCUMENTS

| | | | |
|---|---|---|---|
| 2003/0231950 A1* | 12/2003 | Raaijmakers | H01L 21/681 414/800 |
| 2008/0072823 A1* | 3/2008 | Yudovsky | C23C 16/4585 118/728 |
| 2009/0279989 A1* | 11/2009 | Wong | H01L 21/68 414/217 |
| 2010/0272347 A1* | 10/2010 | Rodnick | H01J 37/20 382/151 |
| 2014/0273505 A1 | 9/2014 | Hsieh et al. | |
| 2015/0336275 A1* | 11/2015 | Mazzocco | G05B 19/401 382/151 |
| 2017/0326733 A1* | 11/2017 | Ramachandran | B25J 9/1692 |

* cited by examiner

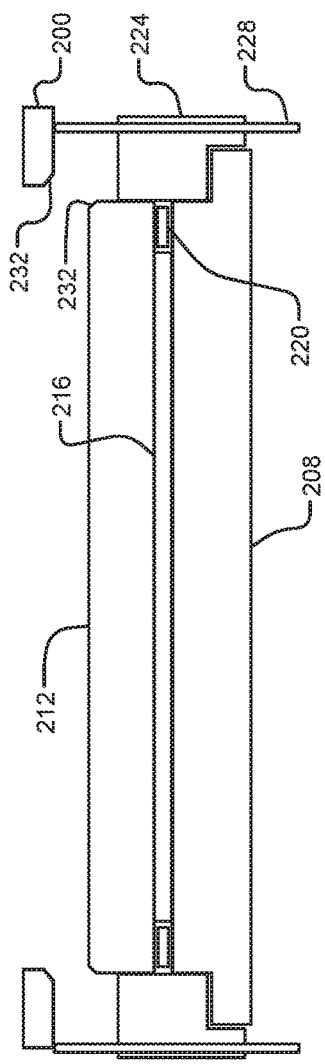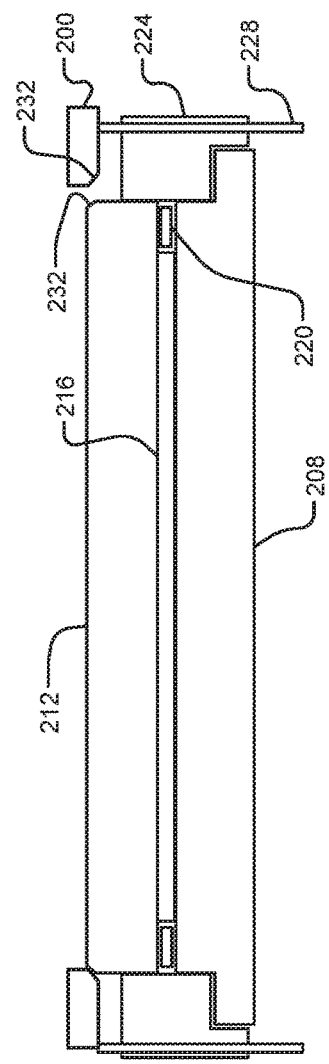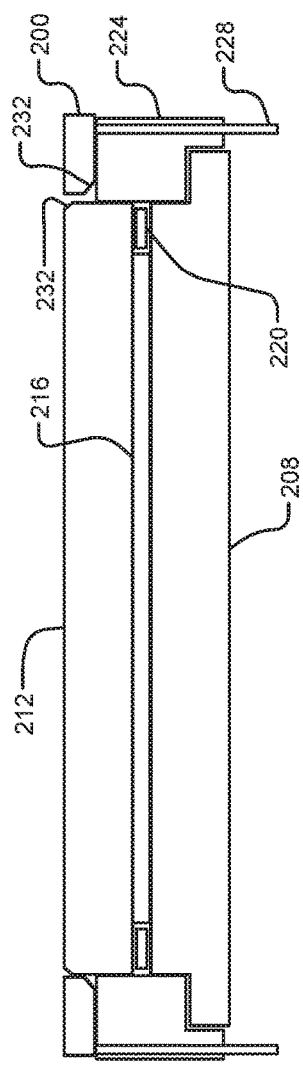

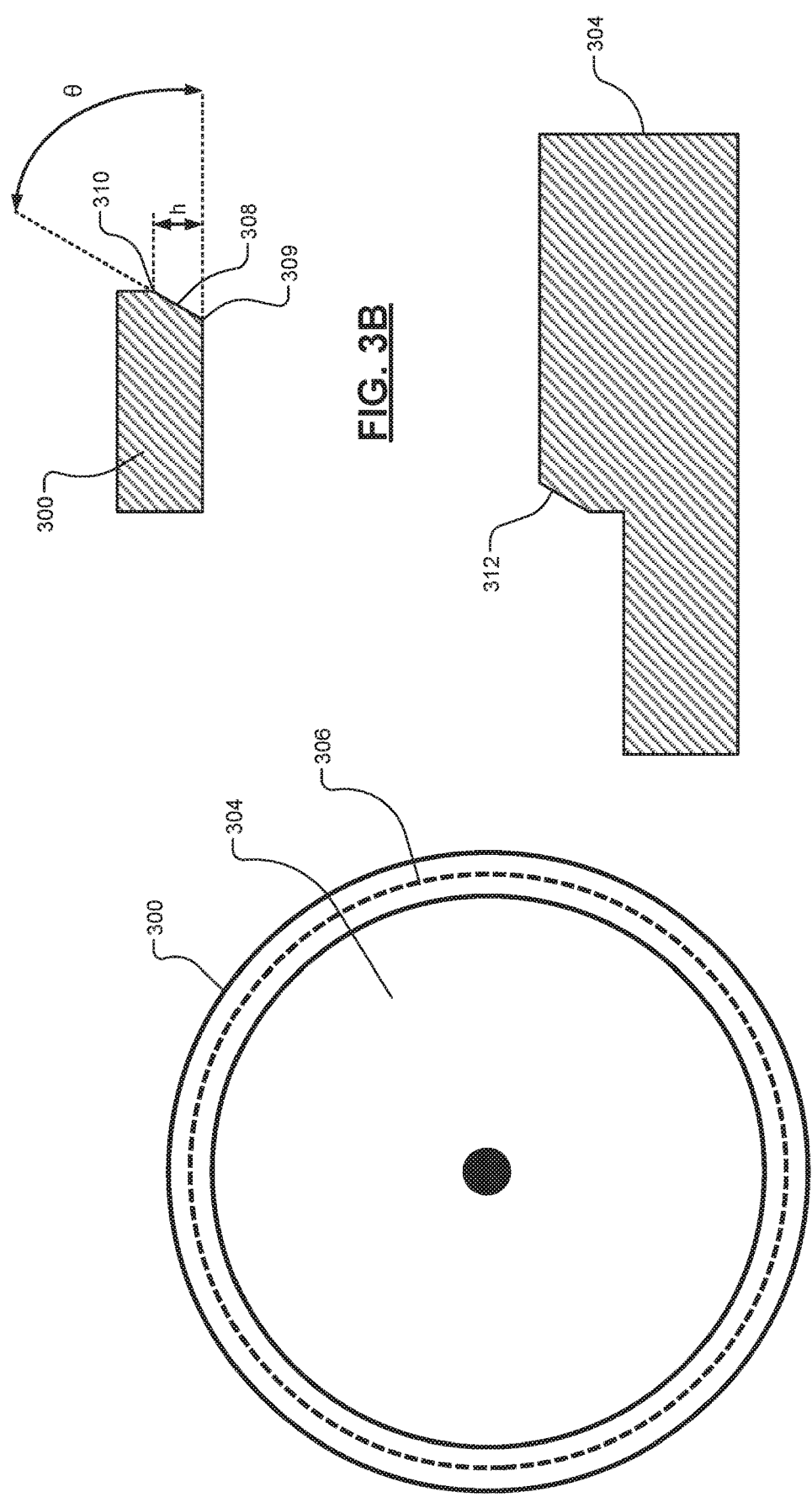

EDGE RING CENTERING METHOD USING RING DYNAMIC ALIGNMENT DATA

CROSS-REFERENCE TO RELATED APPLICATIONS

This application claims the benefit of U.S. Provisional Application No. 62/421,569, filed on Nov. 14, 2016. The entire disclosures of the applications referenced above are incorporated herein by reference.

FIELD

The present disclosure relates to systems and methods for aligning an edge ring in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

The substrate support may include a ceramic layer arranged to support a wafer. For example, the wafer may be clamped to the ceramic layer during processing. The substrate support may include an edge ring arranged around an outer portion (e.g., outside of and/or adjacent to a perimeter) of the substrate support. The edge ring may be provided to confine plasma to a volume above the substrate, protect the substrate support from erosion caused by the plasma, etc.

SUMMARY

A system for determining an alignment of an edge ring on a substrate support includes a robot control module configured to control a robot to place the edge ring onto the substrate support and retrieve the edge ring from the substrate support. An alignment module is configured to determine a plurality of first positions of the edge ring on the robot prior to being placed onto the substrate support and determine a plurality of second positions of the edge ring on the robot subsequent to being retrieved from the substrate support. An edge ring position module configured to determine a centered position of the edge ring relative to the substrate support based on offsets between the plurality of first positions and the plurality of second positions.

In other features, to determine the plurality of first positions and the plurality of second positions, the system communicates with an imaging device configured to detect the plurality of first positions and the plurality of second positions. An inner diameter of the edge ring is configured to cause the edge ring to shift relative to the substrate support when the edge ring is placed onto the substrate support.

In other features, the offsets between the plurality of first positions and the plurality of second positions indicate a magnitude that the edge ring shifted when placed onto the substrate support and a direction that the edge ring shifted when placed onto the substrate support. The plurality of first positions include first shifted placement positions corresponding to placement of the edge ring in a first offset direction relative to the substrate support and second shifted placement positions corresponding to placement of the edge ring in a second offset direction relative to the substrate support. The plurality of second positions include first shifted retrieval positions indicating respective magnitudes that the edge ring shifted when the edge ring was placed in the first shifted placement positions and second shifted retrieval positions indicating respective magnitudes that the edge ring shifted when the edge ring was placed in the second shifted placement positions.

In other features, wherein the edge ring position module is configured to calculate a first slope defined by the first shifted retrieval positions and a second slope defined by the second shifted retrieval positions. The edge ring position module is configured to determine the centered position based on a midpoint between the first slope and the second slope. The offsets between the plurality of first positions and the plurality of second positions include first offsets corresponding to a first axis and second offsets corresponding to a second axis. The first axis corresponds to a horizontal axis and the second axis corresponds to a rotational axis.

In other features, a substrate processing system includes the system and further includes a processing chamber. The substrate support is arranged within the processing chamber.

A method for determining an alignment of an edge ring on a substrate support includes controlling a robot to place the edge ring onto the substrate support and retrieve the edge ring from the substrate support, determining a plurality of first positions of the edge ring on the robot prior to being placed onto the substrate support, determining a plurality of second positions of the edge ring on the robot subsequent to being retrieved from the substrate support, and determining a centered position of the edge ring relative to the substrate support based on offsets between the plurality of first positions and the plurality of second positions.

In other features, the offsets between the plurality of first positions and the plurality of second positions indicate a magnitude that the edge ring shifted when placed onto the substrate support and a direction that the edge ring shifted when placed onto the substrate support. The plurality of first positions include first shifted placement positions corresponding to placement of the edge ring in a first offset direction relative to the substrate support and second shifted placement positions corresponding to placement of the edge ring in a second offset direction relative to the substrate support. The plurality of second positions include first shifted retrieval positions indicating respective magnitudes that the edge ring shifted when the edge ring was placed in the first shifted placement positions and second shifted retrieval positions indicating respective magnitudes that the edge ring shifted when the edge ring was placed in the second shifted placement positions.

In other features, the method further includes calculating a first slope defined by the first shifted retrieval positions and a second slope defined by the second shifted retrieval positions. The centered position is determined based on a midpoint between the first slope and the second slope. The offsets between the plurality of first positions and the plurality of second positions include first offsets corresponding to a horizontal axis and second offsets corresponding to a rotational axis.

In other features, a substrate processing system is configured to execute the method.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 2A, 2B, and 2C illustrate example placement of an edge ring on a substrate support according to the present disclosure;

FIG. 3A is an example edge ring in a desired centered position relative to a ceramic layer according to the present disclosure;

FIG. 3B illustrates an example chamfered edge of an inner diameter of an edge ring according to the present disclosure;

FIG. 3C illustrates an example chamfered edge of an outer diameter of the ceramic layer according to the present disclosure;

In the drawings, reference numbers may be reused to identify similar and/or identical elements.

DETAILED DESCRIPTION

Figure 1:
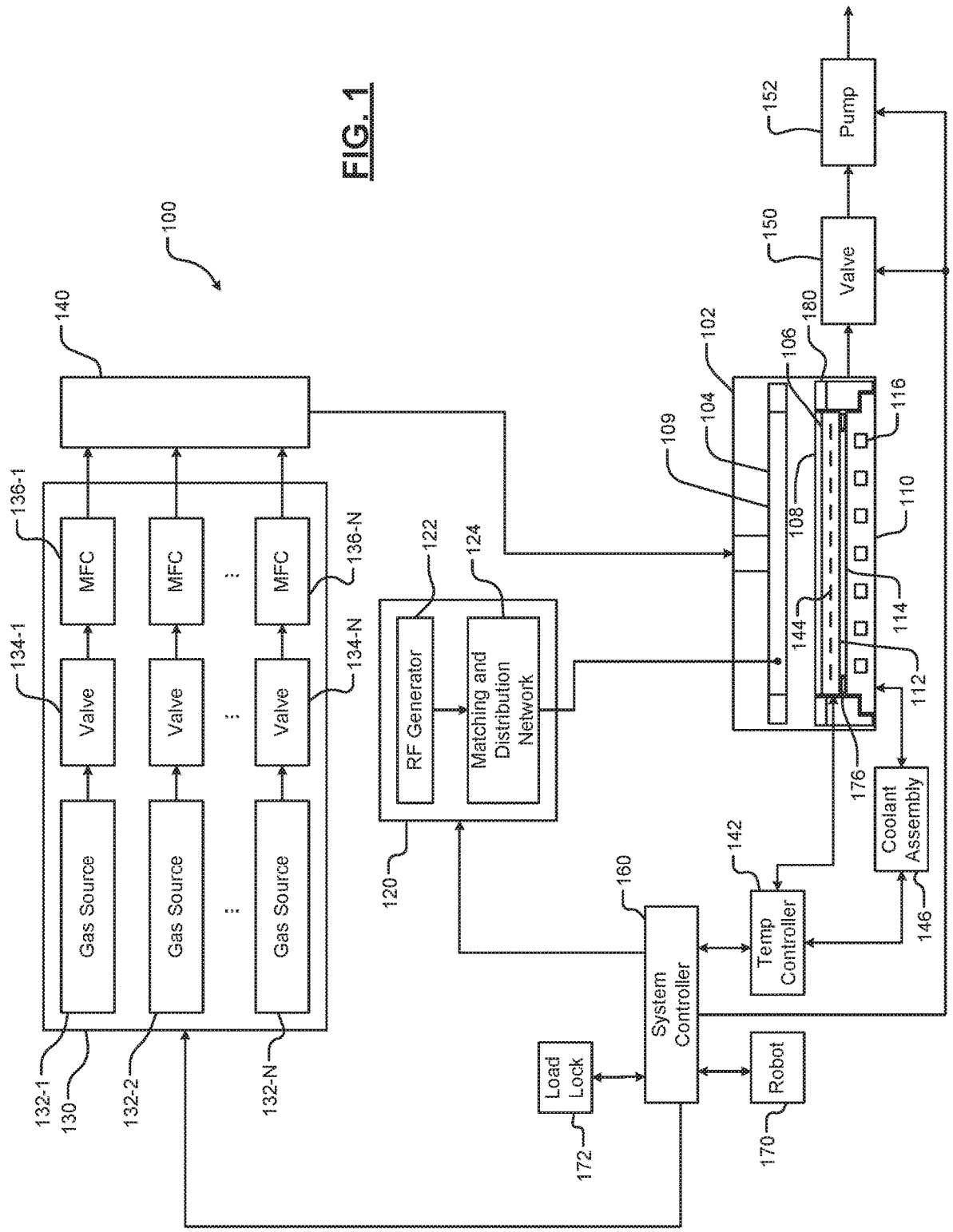
FIG. 1 is a functional block diagram of an example processing chamber according to the present disclosure.

A substrate support in a substrate processing system may include an edge ring. In some systems, a robot/handler (e.g., a vacuum transfer module, or VTM, robot) used to transfer substrates to and from a substrate support within a processing chamber may also be configured to transfer edge rings to and from the chamber. In other words, the robot may be configured to install and remove edge rings from the substrate support. For example, edge rings may be consumable (i.e., edge rings may wear out over time) and therefore are periodically replaced.

Accurate placement of the edge ring on the substrate support may be difficult. For example, a desired position of the edge ring may be a centered position relative to the substrate support. In some examples, the robot may be configured to transfer the edge ring to a predetermined, known centered position relative to the substrate support. However, replacement of components of the substrate support, maintenance within the processing chamber, etc. may cause a center position of the substrate support to change. Accordingly, edge rings transferred to the substrate support using the previously predetermined centered position may not be properly aligned with the substrate support. In some examples, the substrate support and/or the edge ring may include a mechanical self-alignment feature configured to cause the edge ring to settle into an approximate centered position on the substrate support.

Some substrate processing systems may implement a dynamic alignment system for aligning substrates on the substrate support using a robot. The robot may be further configured to transfer edge rings to and from the substrate support. The robot may be controlled according to predetermined calibration data to center the edge ring on the substrate support. For example, a sample or test edge ring may be manually centered on the substrate support. The robot may be calibrated by controlling the robot to retrieve the test edge ring from the substrate support. Coordinates of the centered test edge ring can then be determined by calculating corresponding position information of the robot during the retrieval (e.g., by monitoring movement/positioning of the robot).

However, properly centering the test edge ring may be difficult. For example, the test edge ring may be configured to have a tight mechanical fit on the substrate support. In some examples, shims and/or other additional mechanical, manually installed features are used to achieve an accurate centered position. After centering, the shims may be removed to facilitate retrieval of the test edge ring by the robot. Installation of the shims may require venting and/or control of other conditions of the processing chamber. Subsequent calibration of the robot to determine the centered position may occur with the processing chamber closed, at vacuum, at elevated process temperatures, etc. These conditions in the processing chamber may cause the manually centered test edge ring to move relative to the substrate support, reducing the accuracy of the calculation of the centered position. Accordingly, the above centering method requires additional hardware (e.g., the test edge ring, shims, etc.), potential for human error due to manual installation and centering of various components, and calibration under personnel-safe, non-process conditions. Further, any additional fine tuning of the calibration requires the processing chamber to be re-opened, requiring additional cleaning steps.

Edge ring alignment systems and methods according to the principles of the present disclosure determine coordinates of the centered position of the edge ring relative to the substrate support. For example, the edge ring alignment systems and methods implement dynamic alignment (DA) measurement to place the edge ring on the substrate support at a first position (e.g., a predetermined, calibrated position), retrieve the edge ring from the substrate support, and determine whether the edge ring moved from the first position to a second position prior to retrieval. A magnitude and direction of movement from the first position to the second position is then used to calculate a centered position of the edge ring relative to the substrate support and the corresponding coordinates for the transfer robot. Example DA measurement systems and methods are described in more detail in U.S. Pat. No. 9,269,529, which is incorporated by reference herein in its entirety. For example, DA measurement systems and methods may implement an optical sensor to determine a position of the edge ring on an end effector of the robot prior to placement on the substrate support and subsequent to retrieval from the substrate support. A change of position of the edge ring relative to the end effector is indicative of movement of the edge ring from the first position to the second position. In other words, movement of the edge ring subsequent to placement on the substrate support translates to the change of the position of the edge ring on the end effector.

For example, a total position offset (i.e., a direction and magnitude of movement from the first position to the second position) may be calculated each time the edge ring is placed on and retrieved from the substrate support. Further, the edge ring and the substrate support may include passive, mechanical alignment features. Accordingly, when the edge ring is placed in a non-centered position, the alignment features may cause the edge ring to automatically shift relative to the substrate support closer to the centered position. This shifting of the edge ring causes an offset between the first, placed position to the second, retrieved position on the end effector of the robot, and the actual centered position can be calculated accordingly.

In one example, the robot places the edge ring on raised lift pins arranged around the substrate support, and the lift pins are lowered to position the edge ring on the substrate support. If the edge ring is not in the centered position, lowering the edge ring causes the edge ring to contact the alignment features (e.g., chamfered or rounded edges at an interface between the edge ring and the substrate support) on the substrate support and, consequently, to shift toward the centered position. For example, the edge ring is configured to be arranged around an upper layer (e.g., a ceramic layer) of the substrate support. Accordingly, an inner diameter of the edge ring may be greater than an outer diameter of the ceramic layer to allow for different rates of thermal expansion over a range of operating temperatures.

In this manner, the edge ring may be repeatedly (e.g., two or more times) placed on and removed from the substrate support with intentional, incremental placement offsets to collect calibration data. The placement offsets may be horizontal offsets on X and Y axes, extension offsets, rotational offsets, etc. Corresponding removal offsets are measured for each of the placement offsets. Accordingly, "U"- or "V"-shaped offset curves can be generated using the removal offset measurements as described below in more detail. For example, sides (e.g., opposite slopes) of the "V"- or "U"-shape in the generated curves correspond to shifting of the edge ring caused by the mechanical alignment features of the substrate support. Accordingly, a mid-point between the sides of the "V"- or "U"-shaped curve corresponds to a desired centered position for a particular axis.

Referring now to FIG. 1, an example substrate processing system 100 is shown. For example only, the substrate processing system 100 may be used for performing etching using RF plasma and/or other suitable substrate processing. The substrate processing system 100 includes a processing chamber 102 that encloses other components of the substrate processing system 100 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a plasma tube, a microwave tube), etc.

For example only, the upper electrode 104 may include a gas distribution device such as a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 112. In some examples, the ceramic layer 112 may comprise a heating layer, such as a ceramic multi-zone heating plate. A thermal resistance layer 114 (e.g., a bond layer) may be arranged between the ceramic layer 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of heating elements 144, such as thermal control elements (TCEs) arranged in the ceramic layer 112. For example, the heating elements 144 may include, but are not limited to, macro heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160. In some examples, a protective seal 176 may be provided around a perimeter of the bond layer 114 between the ceramic layer 112 and the baseplate 110.

The substrate support 106 includes an edge ring 180. The edge ring 180 according to the principles of the present disclosure may be moveable (e.g., moveable upward and downward in a vertical direction) relative to the substrate support 106. For example, the edge ring 180 may be controlled via an actuator and lift pins responsive to the controller 160 as described below in more detail. The controller 160 and the robot 170 may be further configured to place and retrieve the edge ring 180 to determine a centered position of the edge ring 180 relative to the substrate support 106 according to the principles of the present disclosure.

Referring now to FIGS. 2A, 2B, and 2C, example placement of an edge ring 200 on a substrate support 204 is shown. The substrate support 204 includes a baseplate 208 and a ceramic layer 212. A bond layer 216 is arranged between the baseplate 208 and the ceramic layer 212. A protective seal 220 is provided around the bond layer 216. In some examples, the baseplate 208 includes an outer ring portion 224.

Edge ring lift pins 228 are provided to raise and lower the edge ring 200. For example, respective actuators (not shown) raise and lower the lift pins 228. As shown in FIG. 2A, the lift pins 228 (and, accordingly, the edge ring 200) are in a raised position and the edge ring 200 is in a non-centered position relative to the ceramic layer 212. For example, the edge ring 200 is placed on the lift pins 228 by a robot (e.g., the robot 170) with the lift pins 228 in the raised position.

In FIG. 2B, the edge ring 200 is shown partially lowered onto the substrate support 204. The partially lowered position corresponds to a position where an inner diameter of the edge ring 200 engages an outer diameter of the ceramic layer 212. One or more of the inner diameter of the edge ring 200 and the outer diameter of the ceramic layer 212 may include mechanical alignment features, such as complementary chamfered edges 232. Accordingly, contact between the respective chamfered edges 232 causes the edge ring 200 to shift relative to the ceramic layer 212. FIG. 2C shows the edge ring 200 in a completely lowered position. Accordingly, the edge ring 200 in the completely lowered position is shifted slightly relative to the edge ring 200 in the original raised position, but is not in a desired centered position.

FIG. 3A shows an example edge ring 300 in a desired centered position relative to a ceramic layer 304. Dashed line 306 indicates an outer edge of the ceramic layer 304 below the edge ring 300. FIG. 3B shows an example chamfered edge 308 of an inner diameter of the edge ring 300. The chamfered edge 308 may have a height h of at least approximately 0.025" (e.g., 0.025"-0035") and an angle θ of approximately 60.0° (e.g., 55.0-65.0°). In some examples, corners 309 and 310 of the chamfered edge 308 may be radiused (i.e., rounded, with a radius of 0.010"). FIG. 3C shows an example chamfered edge 312 of an outer diameter of the ceramic layer 304. As shown, the ceramic layer 304 has a stepped configuration. In other examples (e.g., as shown in FIGS. 2A, 2B, and 2C), the ceramic layer 304 may have a non-stepped configuration.

Figure 4:
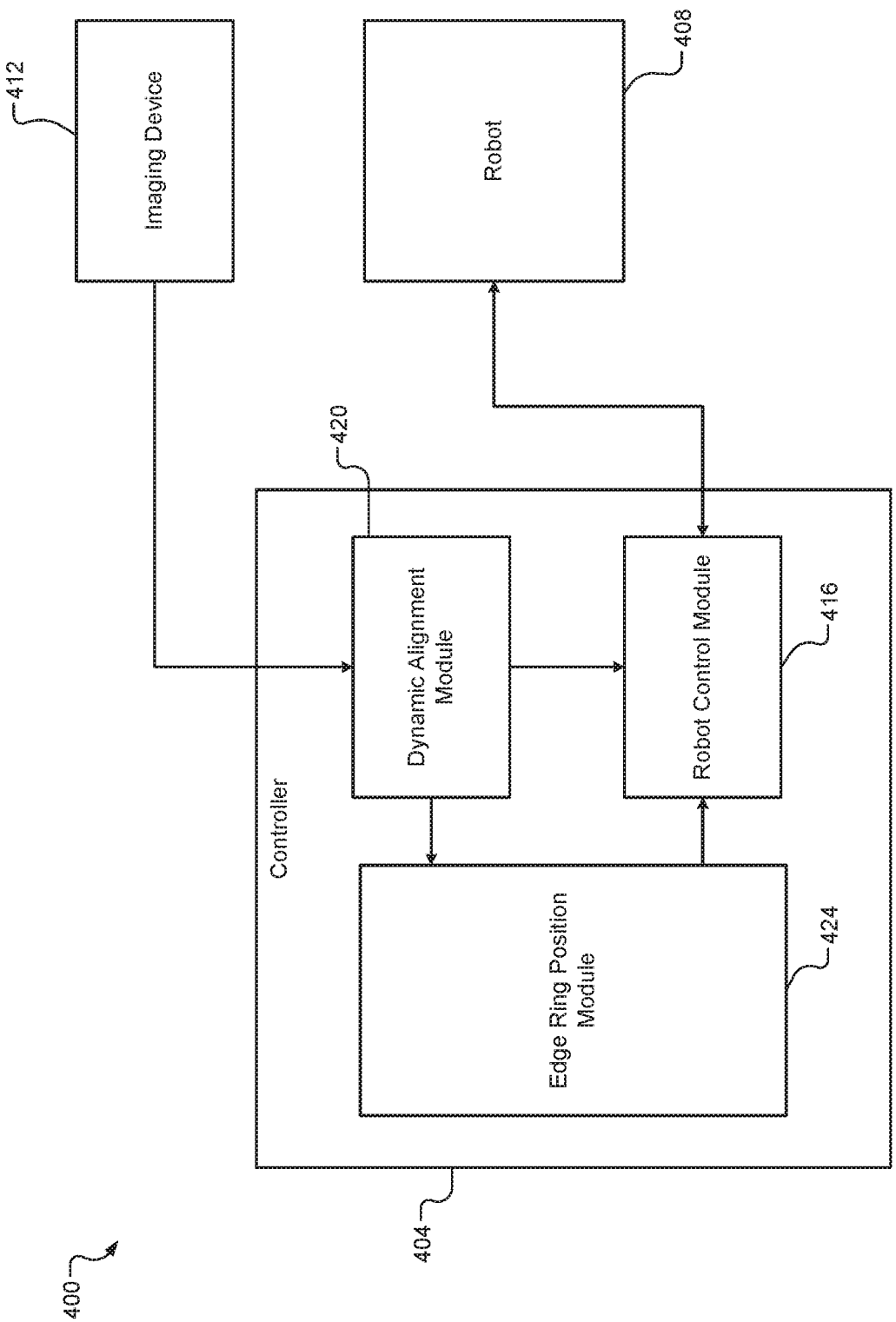
FIG. 4 is an example edge ring alignment system according to the present disclosure.

Referring now to FIG. 4, an example edge ring alignment system 400 according to the principles of the present disclosure is shown. The system 400 includes a controller 404 (e.g., corresponding to the controller 160 of FIG. 1), a robot 408 (e.g., corresponding to the robot 170 of FIG. 1, such as a vacuum transfer module robot), and an imaging device 412. For example, the imaging device 412 includes a camera, sensor, etc. configured to detect objects within a viewing area. In one example, the imaging device 412 may project one or more beams toward an end effector of the robot 408, and sense when an edge ring interrupts the beams. Accordingly, the imaging device 412 is configured to determine a position of the edge ring on the end effector based on a pattern indicative of which beams are interrupted. For example, the pattern may be compared to a predetermined pattern indicative of a centered position on the end effector to determine a change of position of the edge ring. The imaging device 412 may be located within a processing chamber, a vacuum transfer module, etc.

The controller 404 may include a robot control module 416, a dynamic alignment (DA) module 420, and an edge ring position module 424. The robot control module 416 controls the robot 408. For example, the robot control module 416 controls the robot 408 to transfer substrates and edge rings between various process modules/chambers, vacuum chambers, etc. The robot 408 according to the principles of the present disclosure includes an end effector configured to place and retrieve edge rings. For example, the robot 408 retrieves an edge ring and transfers the edge ring to a substrate support in a processing chamber. During the transfer, the edge ring is passed through a viewing area of the imaging device 412 to detect a first position of the edge ring on the end effector. The edge ring is placed on the substrate support. The edge ring is then retrieved from the substrate support and again passed through the viewing area of the imaging device to detect a second position of the edge ring on the end effector. Accordingly, an offset between the first position and the second position corresponds to a magnitude and direction that the edge ring shifted when placed on the substrate support.

The DA module 420 receives position detection data from the imaging device 412. For example, the position detection data may include data indicative of beam patterns generated when the edge ring passed through the viewing area of the imaging device 412. The DA module 420 may be configured to calculate actual positions of the edge ring on the end effector and offsets between positions (i.e., position information) based on the position detection data and provide the position information to the edge ring position module 424 and the robot control module 416.

The edge ring position module 424 receives the position information indicating the positions of the edge ring on the end effector and correlates positions of the edge ring on the end effector to positions of the edge ring on the substrate support. The edge ring position module 424 calculates a centered position of the edge ring relative to the substrate support using these correlated positions as described below in more detail.

In one example, the system 400 first determines a center of a substrate support using any suitable method. For example, DA alignment may be performed for substrates being processed within the processing chamber to determine a center of the substrate support. The determined center of the substrate support may then be used as an initial centered position of the edge ring. The system 400 then performs a calibration process according to the present disclosure to calculate an actual centered position of the edge ring relative to the substrate support.

Figure 5A:
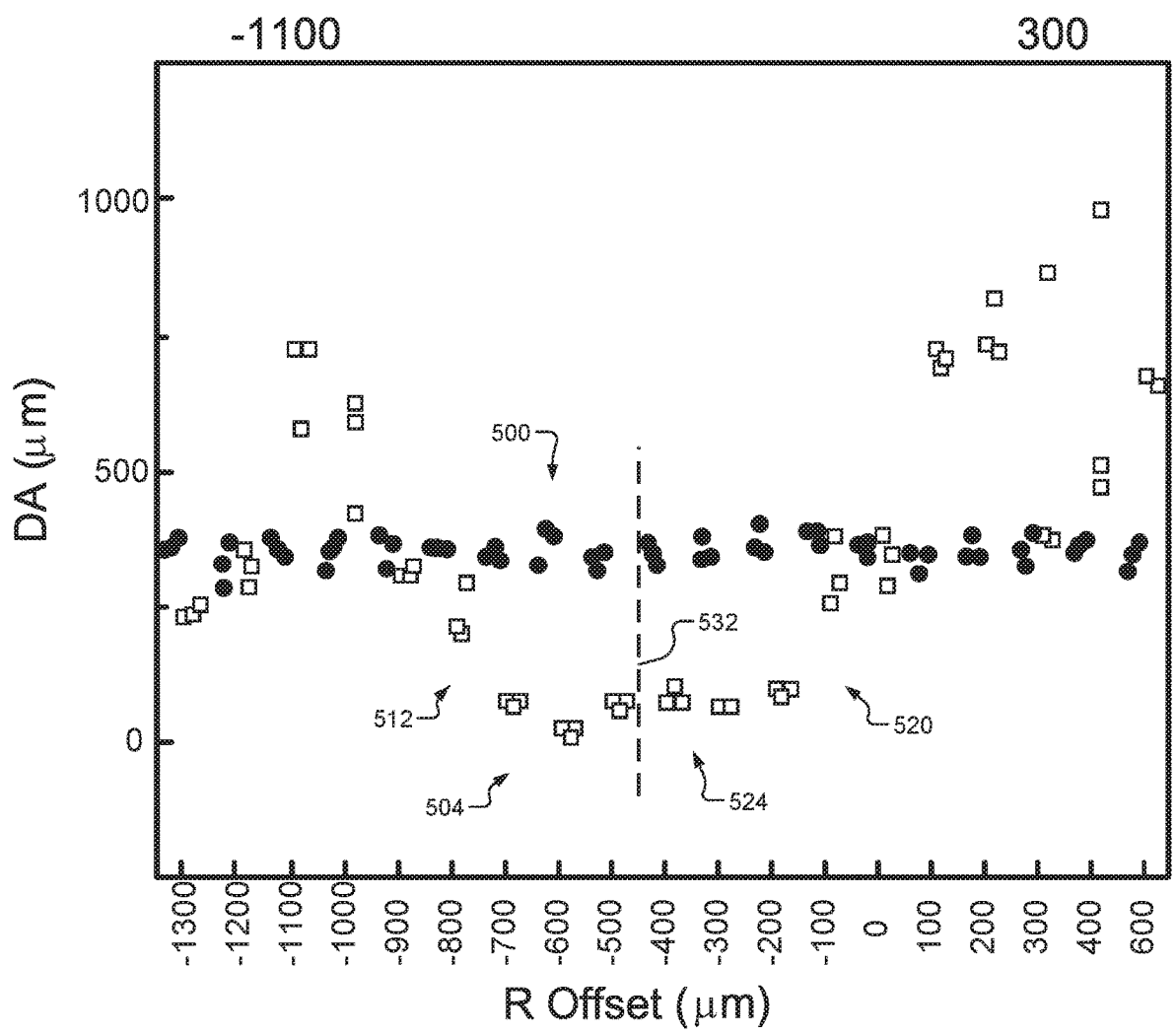
FIGS. 5A and 5B illustrate an example edge ring position calculation according to the present disclosure.
Figure 5B:
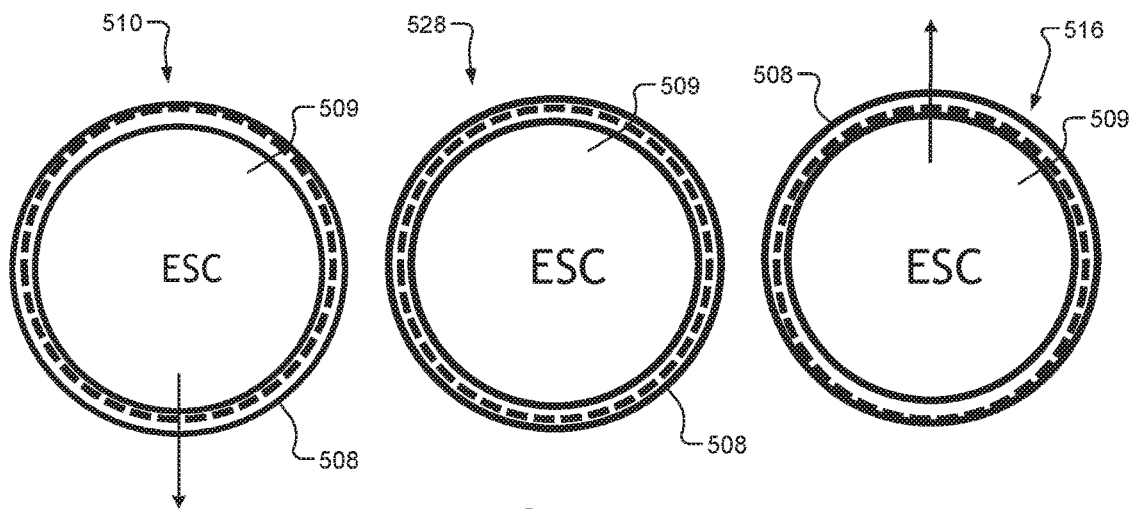

An example edge ring position calculation is shown with respect to FIGS. 5A and 5B. For example, a position of the edge ring may have associated R and T offsets (i.e., horizontal offsets along an R axis, rotational offsets along a T axis, etc.). FIG. 5A shows a plurality of placement positions 500 of the edge ring and corresponding retrieval positions 504 of the edge ring along the R axis. For example, the placement positions 500 are calculated according to the previously determined position of the edge ring on the end effector and an intentional offset of the placement of the edge ring in the R direction (e.g., R offsets of −1300 μm, −1200 μm, etc. through 600 μm from the determined initial centered position). Conversely, the retrieval positions 504 are calculated according to determinations of the position of the edge ring on the end effector subsequent to retrieval.

In one example, the edge ring may be placed at −1100 μm, resulting in a shift from a placement position to a retrieval position of greater than 500 μm. This placement position may correspond to the position of an edge ring 508 on a substrate support 509 as shown at 510 in FIG. 5B. The edge ring 508 may then be sequentially placed at positions corresponding to incrementally decreasing R offsets of −1000 μm, −900 μm, etc., corresponding to retrieval positions having shifts of approximately 400 μm, 250 μm, etc. In other words, when the edge ring 508 is placed a first time at a relatively large offset as shown at 510, the edge ring 508 shifts a relatively greater amount when lowered onto the substrate support 509 as described in FIGS. 2A-2C. When the edge ring 508 is placed a second time at a smaller offset, the edge ring 508 shifts a smaller amount. Each time the edge ring 508 is placed at an incrementally smaller offset, the edge ring 508 will shift an incrementally smaller amount as illustrated by a slope 512 of the retrieval positions.

Conversely, the placement position at approximately −100 μm corresponds to the edge ring 508 shifting in an opposite direction as the edge ring 508 is placed in a position shifted toward an opposite side of the substrate support 509. Accordingly, the edge ring 508 shifts a greater amount as the placement position incrementally approaches a position shown at 516 in FIG. 5B, as illustrated by a slope 520 of corresponding retrieval positions.

A relatively flat region 524 of the retrieval positions 504 between approximately −800 μm and −200 μm corresponds to an offset between the placement positions and the retrieval positions of approximately 0. In other words, the flat region 524 corresponds to placement positions where lowering the edge ring 508 onto the substrate support 509 did not result in any shifting caused by the mechanical alignment features on the edge ring 508 and/or the ceramic layer. Accordingly, a center point of the flat region 524 (i.e., a midway point 532 between respective beginnings of the slopes 512 and 520) corresponds to an approximate centered position of the edge ring 508 on the R axis as shown at 528.

Figure 6:
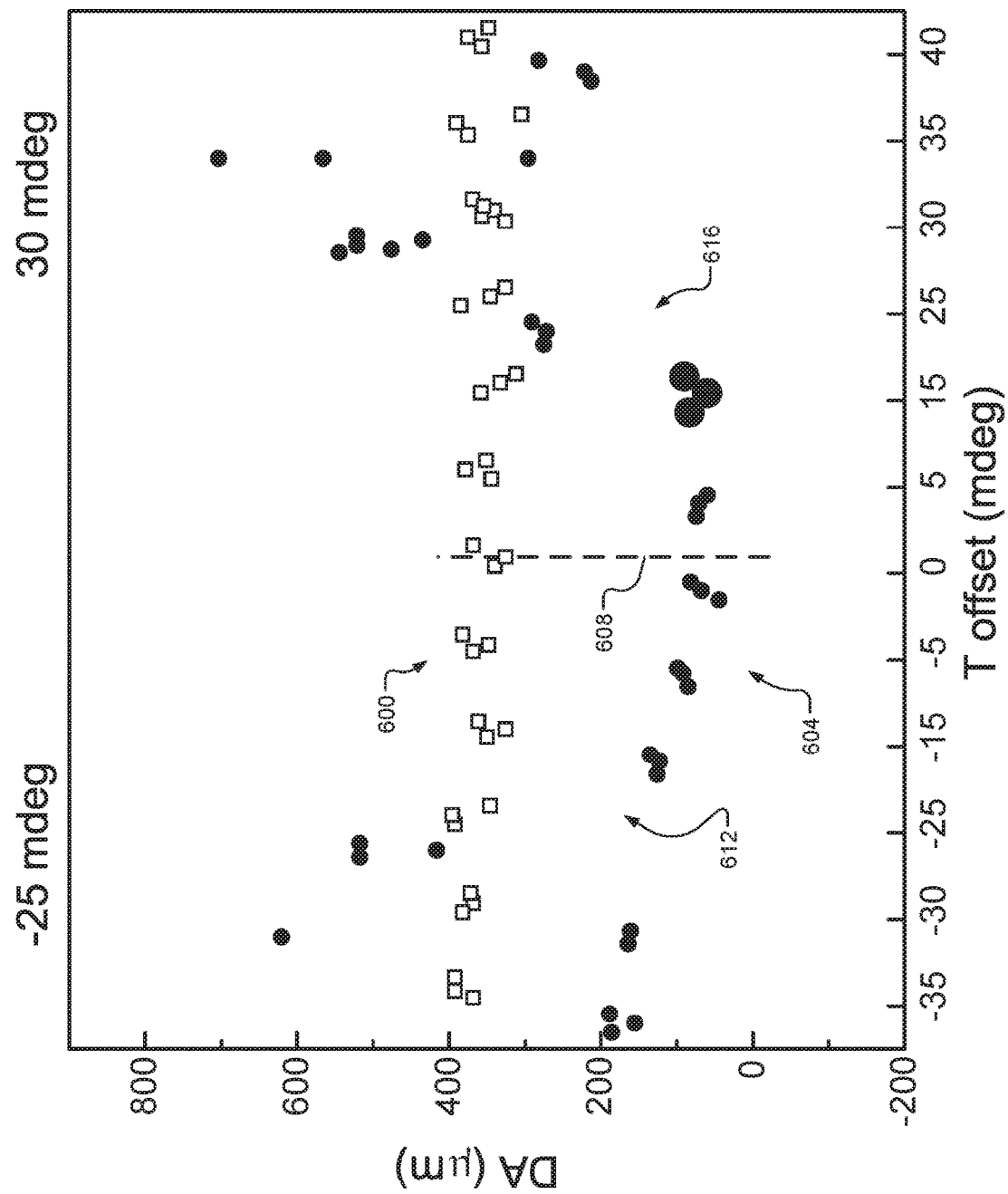
FIG. 6 illustrates another example edge ring position calculation according to the present disclosure.

The centered position may then be calculated relative to other axes. For example, FIG. 6 illustrates placement positions 600 and retrieval positions 604 when the calculation is performed for the T axis, and placement T offsets correspond to rotational offsets. For example, a centered position on the T axis may correspond to a midpoint 608 between respective beginnings of slopes 612 and 616. The calculated centered position is stored as the desired centered position of the edge ring 508 relative to the substrate support 509 for subsequent placement of edge rings. Control of the robot 408 is calibrated according to the stored centered position. The edge ring position calculation can be repeated periodically, whenever maintenance is performed on the substrate support 509, etc.

Figure 7:
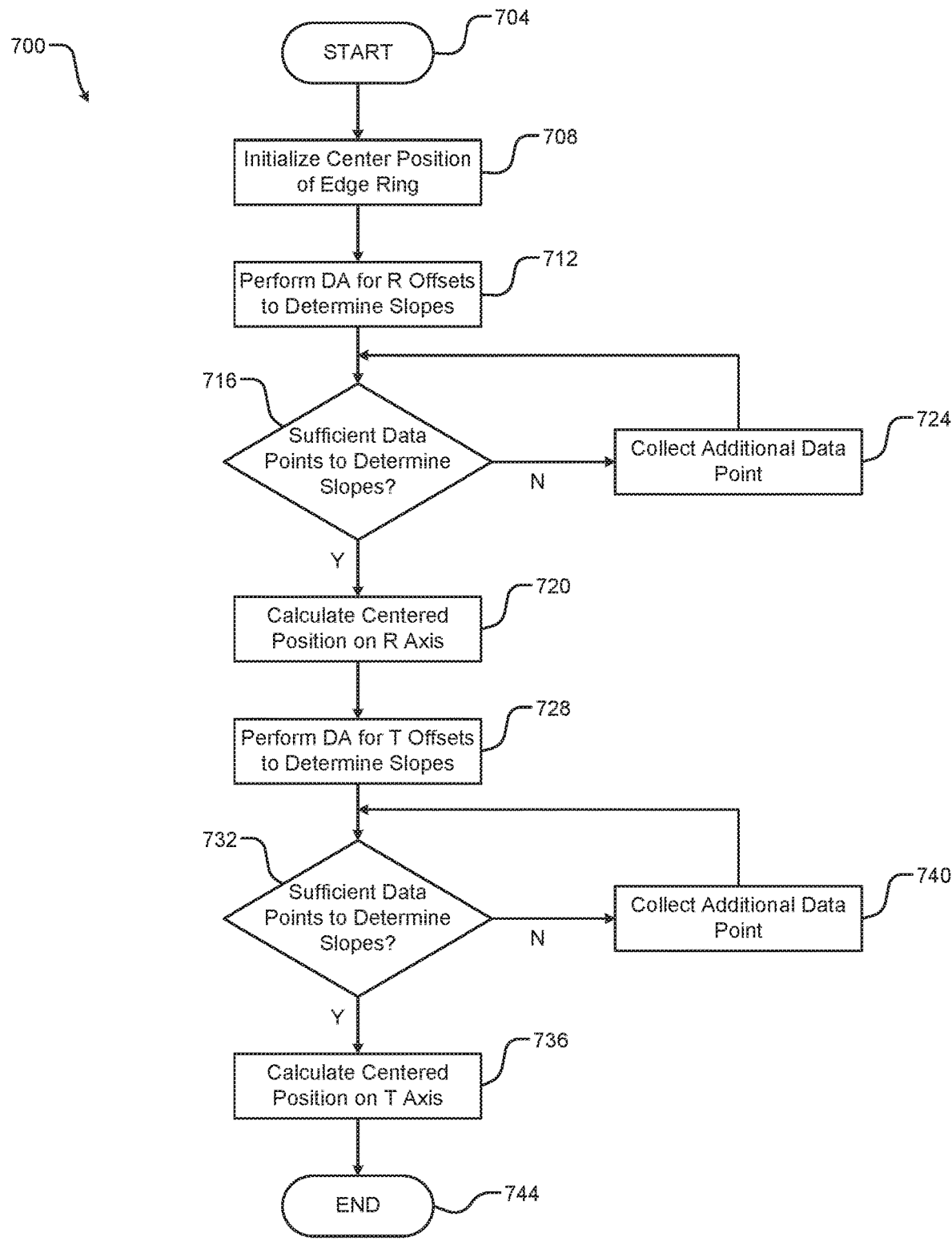
FIG. 7 illustrates steps of an example method for determining a centered position of an edge ring according to the present disclosure.

FIG. 7 illustrates an example method 700 for determining a centered position of an edge ring begins at 704. At 708, a centered position of the edge ring is initialized. For example, a previously determined center position (e.g., a center position determined, using a DA system, for a substrate or wafer relative to the substrate support) is initialized as the centered position of the edge ring. At 712, dynamic alignment is performed for various R offsets of the edge ring to determine slopes (e.g., the slopes 512 and 520 as described in FIG. 5A) corresponding to amounts that the edge ring shifted in the R direction. At 716, the method 700 determines whether the slopes were accurately determined. For example, the method 700 may determine whether sufficient data points were calculated to estimate the slopes. If true, the method 700 continues to 720. If false, the method 700 continues to 724.

At 724, the method 700 collects an additional data point. For example, the method 700 places the edge ring at a position corresponding to one of the two slopes to acquire an additional R offset and corresponding shift to facilitate calculation of the slope. In some examples, five data points may be sufficient to estimate a corresponding slope. In other examples, additional data points (e.g., seven or more) may be used to estimate the slope. At 720, the method 700 calculates a centered position on the R axis based on a midpoint between the determined slopes (e.g., as described in FIG. 5A).

At 728, the method 700 performs dynamic alignment for various T offsets of the edge ring to determine slopes (e.g., the slopes 612 and 616 as described in FIG. 6) corresponding to amounts that the edge ring shifted in the T direction. At 732, the method 700 determines whether the slopes were accurately determined. For example, the method 700 may determine whether sufficient data points were calculated to estimate the slopes. If true, the method 700 continues to 736. If false, the method 700 continues to 740. At 740, the method 700 collects an additional data point. For example, the method 700 places the edge ring at a position corresponding to one of the two slopes to acquire an additional T offset and corresponding shift to facilitate calculation of the slope. At 736, the method 700 calculates a centered position on the T axis based on a midpoint between the determined slopes (e.g., as described in FIG. 6). The method 700 ends at 744.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for determining an alignment of an edge ring on a substrate support, the system comprising:
   a robot control module configured to control a robot to place the edge ring onto the substrate support and retrieve the edge ring from the substrate support;
   an alignment module configured to (i) calculate a plurality of first positions of the edge ring on the robot prior to being placed onto the substrate support and (ii) calculate a plurality of second positions of the edge ring on the robot subsequent to being retrieved from the substrate support; and
   an edge ring position module configured to calculate a centered position of the edge ring relative to the substrate support based on offsets between the calculated plurality of first positions of the edge ring on the robot prior to being placed onto the substrate support and the calculated plurality of second positions of the edge ring on the robot subsequent to being retrieved from the substrate support.

2. The system of claim 1, wherein, to calculate the plurality of first positions and the plurality of second positions, the system communicates with an imaging device configured to detect the plurality of first positions and the plurality of second positions.

3. The system of claim 1, wherein an inner diameter of the edge ring is configured to cause the edge ring to shift relative to the substrate support when the edge ring is placed onto the substrate support.

4. The system of claim 1, wherein the offsets between the plurality of first positions and the plurality of second positions indicate (i) a magnitude that the edge ring shifted when placed onto the substrate support and (ii) a direction that the edge ring shifted when placed onto the substrate support.

5. The system of claim 4, wherein the plurality of first positions include (i) first shifted placement positions corresponding to placement of the edge ring in a first offset direction relative to the substrate support and (ii) second shifted placement positions corresponding to placement of the edge ring in a second offset direction relative to the substrate support.

6. The system of claim 5, wherein the plurality of second positions include (i) first shifted retrieval positions indicating respective magnitudes that the edge ring shifted when the edge ring was placed in the first shifted placement positions and (ii) second shifted retrieval positions indicating respective magnitudes that the edge ring shifted when the edge ring was placed in the second shifted placement positions.

7. The system of claim 6, wherein the edge ring position module is configured to calculate (i) a first slope defined by the first shifted retrieval positions and (ii) a second slope defined by the second shifted retrieval positions.

8. The system of claim 7, wherein the edge ring position module is configured to calculate the centered position based on a midpoint between the first slope and the second slope.

9. The system of claim 4, wherein the offsets between the plurality of first positions and the plurality of second positions include first offsets corresponding to a first axis and second offsets corresponding to a second axis.

10. The system of claim 9, wherein the first axis corresponds to a horizontal axis and the second axis corresponds to a rotational axis.

11. A substrate processing system incorporating the system of claim 1, the substrate processing system further comprising:
a processing chamber, wherein the substrate support is arranged within the processing chamber.

12. A method for determining an alignment of an edge ring on a substrate support, the method comprising:
controlling a robot to place the edge ring onto the substrate support and retrieve the edge ring from the substrate support;
calculating a plurality of first positions of the edge ring on the robot prior to being placed onto the substrate support;
calculating a plurality of second positions of the edge ring on the robot subsequent to being retrieved from the substrate support; and
calculating a centered position of the edge ring relative to the substrate support based on offsets between the calculated plurality of first positions of the edge ring on the robot prior to being placed onto the substrate support and the calculated plurality of second positions of the edge ring on the robot subsequent to being retrieved from the substrate support.

13. The method of claim 12, wherein the offsets between the plurality of first positions and the plurality of second positions indicate (i) a magnitude that the edge ring shifted when placed onto the substrate support and (ii) a direction that the edge ring shifted when placed onto the substrate support.

14. The method of claim 13, wherein the plurality of first positions include (i) first shifted placement positions corresponding to placement of the edge ring in a first offset direction relative to the substrate support and (ii) second shifted placement positions corresponding to placement of the edge ring in a second offset direction relative to the substrate support.

15. The method of claim 14, wherein the plurality of second positions include (i) first shifted retrieval positions indicating respective magnitudes that the edge ring shifted when the edge ring was placed in the first shifted placement positions and (ii) second shifted retrieval positions indicating respective magnitudes that the edge ring shifted when the edge ring was placed in the second shifted placement positions.

16. The method of claim 15, further comprising calculating (i) a first slope defined by the first shifted retrieval positions and (ii) a second slope defined by the second shifted retrieval positions.

17. The method of claim 16, further comprising calculating the centered position based on a midpoint between the first slope and the second slope.

18. The method of claim 13, wherein the offsets between the plurality of first positions and the plurality of second positions include first offsets corresponding to a horizontal axis and second offsets corresponding to a rotational axis.

19. A substrate processing system configured to execute the method of claim 12.

* * * * *